(12) United States Patent
Hammes et al.

(10) Patent No.: US 9,406,659 B2
(45) Date of Patent: Aug. 2, 2016

(54) TRANSISTOR ARRANGEMENT

(71) Applicant: Ampleon Netherlands B.V., Nijmegen (NL)

(72) Inventors: Petra Christina Anna Hammes, Westervoort (NL); Josephus Henricus Bartholomeus van der Zanden, Best (NL); Rob Mathijs Heeres, Nijmegen (NL); Albert Gerardus Wilhelmus Philipus van Zuijlen, Grave (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 14/524,663

(22) Filed: Oct. 27, 2014

(65) Prior Publication Data

US 2015/0115343 A1 Apr. 30, 2015

(30) Foreign Application Priority Data

Oct. 31, 2013 (EP) .................................... 13191204

(51) Int. Cl.
*H01L 25/16* (2006.01)
*H01L 23/522* (2006.01)
*H01L 23/00* (2006.01)
*H01L 23/66* (2006.01)

(52) U.S. Cl.
CPC ............ *H01L 25/16* (2013.01); *H01L 23/5223* (2013.01); *H01L 23/66* (2013.01); *H01L 24/09* (2013.01); *H01L 24/49* (2013.01); *H01L 2223/6611* (2013.01); *H01L 2223/6655* (2013.01); *H01L 2224/04042* (2013.01); *H01L 2224/45015* (2013.01); *H01L 2224/4813* (2013.01); *H01L 2224/48101* (2013.01); *H01L 2224/48157* (2013.01); *H01L 2224/48195* (2013.01); *H01L 2224/49* (2013.01); *H01L2924/00014* (2013.01); *H01L 2924/1205* (2013.01); *H01L 2924/13091* (2013.01); *H01L 2924/181* (2013.01)

(58) Field of Classification Search
CPC ................. H01L 2924/00; H01L 2924/0002; H01L 27/10894; H01L 27/10852; H01L 27/10855; H01L 27/0207; H01L 27/10876; H01L 27/10814; H01L 27/10885; H01L 27/0629; H01L 28/91
See application file for complete search history.

(56) References Cited

U.S. PATENT DOCUMENTS 7,243,423 B2 * 7/2007 Wood .............................. 29/846
7,557,421 B1 * 7/2009 Shealy et al. ................. 257/499
(Continued)

FOREIGN PATENT DOCUMENTS

EP 1227520 A2 * 7/2002 ............. H01L 27/12
EP 1 460 687 A1 9/2004
(Continued)

OTHER PUBLICATIONS

Extended European Search Report for application No. 13191204.0 (Apr. 30, 2014).

*Primary Examiner* — Michelle Mandala
(74) *Attorney, Agent, or Firm* — McDonnell Boehnen Hulbert & Berghoff LLP

(57) ABSTRACT

A transistor arrangement comprising an electrically conductive substrate; a semiconductor body including a transistor structure, the transistor structure including a source terminal connected to said substrate; a bond pad providing a connection to the transistor structure configured to receive a bond wire; wherein the semiconductor body includes an RF-return current path for carrying return current associated with said bond wire, said RF-return current path comprising a strip of metal arranged on said body, said strip configured such that it extends beneath said bond pad and is connected to said source terminal of the transistor structure.

15 Claims, 3 Drawing Sheets

(56) References Cited

U.S. PATENT DOCUMENTS

2003/0102494 A1*  6/2003  Akamine ............ H01L 23/4824
                                                     257/202
2012/0132969 A1   5/2012  Tiemeijer et al.

FOREIGN PATENT DOCUMENTS

EP      2 509 105 A1    10/2012
EP      2509105 A1  *   10/2012  .............. H01L 23/64

* cited by examiner

TRANSISTOR ARRANGEMENT

CROSS-REFERENCE TO RELATED APPLICATIONS

This application claims the priority under 35 U.S.C. §119 of European patent application no. 13191204.0, filed on Oct. 31, 2013, the contents of which are incorporated by reference herein.

This invention relates to a transistor arrangement and a transistor package. The invention also relates to a field effect transistor arrangement and package, a power amplifier and, in particular, a LDMOS power amplifier. Further, the invention relates to cellular base station including said power amplifier.

Power amplifier transistors are used in cellular base stations. The overall efficiency of the transistor is important. A common power amplifier comprises an RF lateral double-diffused metal-oxide-semiconductor (LDMOS) transistor.

In a known discrete RF-LDMOS power amplifier transistor, the transistor structure includes a source, drain and gate and is located on a silicon die that is contained within a package. The package further includes a matching network comprising bond wires and discrete capacitors. The bond wires also allow for connects to/from the transistor structure. The transistor structure typically includes bond pads to which the bond wires connect. The transistor structure may include a bond pad associated with a gate of the transistor and a bond pad associated with the drain of the transistor. The source of the transistor is typically connected through a fairly low-resistivity (i.e. 10 mΩ·cm) substrate, such as low Ohmic silicon.

When a current flows through a bond wire, a return current is generated in the silicon die beneath the bond wire. Despite the use of low Ohmic silicon, there is still significant resistance to the flow of the return current, which leads to losses in the RF-LDMOS arrangement. It is known to provide a RF-return current path to carry the return current and thereby improve efficiency. However, the form of the RF-return current path can have a significant effect on the overall efficiency, gain and reliability of the device and ease of manufacture.

According to a first aspect of the invention we provide a transistor arrangement comprising;
  an electrically conductive substrate;
  a semiconductor body including a transistor structure, the transistor structure including a source terminal connected to said substrate;
  a bond pad providing a connection to the transistor structure configured to receive a bond wire;
  wherein the semiconductor body includes an RF-return current path for carrying return current associated with said bond wire, said RF-return current path comprising a strip of metal arranged on said body, said strip configured such that it extends beneath said bond pad and connects to said source terminal of the transistor structure.

This is advantageous as forming the RF-return current path as a strip that connects to the source terminal of the transistor structure leads to an efficient field effect transistor arrangement. The return current can flow in the metal RF-return current path directly to the source terminal rather than passing through the semiconductor body to reach the substrate or source terminal. Overall the losses are reduced at both the input and output of a transistor. At the output lower losses will increase the drain efficiency and at the input it will increase the gain.

The RF-return current strip may extend to an edge of the semiconductor body. The semiconductor body may comprise a die of an integrated circuit and therefore the strip extends to a particular edge of the die. Accordingly, the bond wire extends over the particular die edge. Thus, the strip is arranged to extend from the active component with which it has a connection to the substrate, across the semiconductor body, following the path of the bond wire, to the die edge.

The RF-return current strip may be connected to the source terminal at a first end and to the substrate at a second, opposite end by at least one via element. This is advantageous as the field effect transistor structure only requires connections to the substrate at either end, which makes it easy to manufacture.

The RF-return current strip may be only connected to the substrate at its first and second ends. The arrangement may include a plurality of discrete RF-return current strips, each strip providing a discrete return current path. Each RF-return current strip may be associated with a corresponding bond wire. Each return current strip may provide a discrete flow path along its length. Accordingly, each strip may be unconnected to any other strip along its length. Each strip may be unconnected to the substrate along its length. The plurality of RF-return current strips may be connected together at their ends by a common source terminal and/or a via element array. It will be appreciated that unconnected may mean unconnected by a material having a greater conductivity than the bulk of the semiconductor body. The RF-return current strips may form a shield.

The RF-return current path may be, at the second end, connected to the substrate by a connection of a matching capacitor forming, with the bond wire, at least part of a matching network associated with the field effect transistor structure.

The or each RF-return current strip may comprise the uppermost layer of the field effect transistor arrangement. The or each RF-return current strip may include a plurality of slots formed in its surface, said slots forming package locking points. The arrangement may be formed within a package and said package physically engages with said slots. This is advantageous as the strips ensure that the arrangement does not present a continuous area of metal in a direction perpendicular to the strips, which ensures reliable manufacturing. In addition, the slots further break up the surface of metal. The strips and slots also provide a surface relief to enable reliable interlocking between an uppermost layer of the arrangement and a package. The package may be applied to the arrangement such that the package material, which may be moulding compound, extends into the slots and between the strips to provide interlocking between the arrangement and the package.

At least one bond wire may extend from the bond pad; said RF-return current strip and said bond wire arranged such that the strip follows a path that extends directly beneath said bond wire. A plurality of RF-current return strips may be provided for each bond wire. Adjacent strips in the plurality of strips may be located in different layers above the substrate, the adjacent strips overlapping in width and wherein a plane of one of the adjacent strips is spaced from a plane of other of the adjacent strips. Thus, the strips overlap when viewed from a direction perpendicular to the plane in which the strips lie.

Said RF-return current strip may be continuous and extend through different layers formed on the semiconductor body. Thus, vias of metal material may connect the parts of the strip that extend along different layers to form a continuous strip of substantially constant conductivity. The conductivity may be continuously higher than that of the semiconductor body over the length of the strip.

Said arrangement may include a further passive component, said RF-return current path providing a connection to the substrate for the passive component. Thus, passive electrical components, i.e. those that only consume power, are provided with a convenient connection to the substrate for a ground connection. It will be appreciated that several passive components may be provided. Further, the arrangement may include a second transistor structure, which may be located at the opposite end of the RF-return current path. The strip may be configured such that it extends beneath a bond pad of the second transistor structure and connects to a source terminal of the second transistor structure.

The transistor structure may comprise a LDMOS transistor.

The source terminal may be formed in an intermediate layer between the semiconductor body and an uppermost layer of the arrangement. The RF-return current strip may extend along the majority of its length as an uppermost layer of the arrangement and, at its end that connects to the source terminal, the strip may be connected to a lower layer (lower than the uppermost layer) in the arrangement by a via, the strip, in said lower layer, extending under the bond pad and connected to the source terminal of the transistor structure. The source terminal of the transistor structure may have a connection to the substrate by vias.

According to a second aspect of the invention we provide a power amplifier comprising the field effect transistor arrangement of the first aspect.

The power amplifier may comprise one or more amplification stages connected by one or more impedance matching networks.

According to a third aspect of the invention we provide an integrated circuit (IC) including the field effect transistor arrangement as defined in the first aspect.

According to a fourth aspect of the invention we provide a cellular base station including the power amplifier of second aspect.

There now follows, by way of example only, a detailed description of embodiments of the invention with reference to the following figures, in which:

DETAILED DESCRIPTION

Figure 1:
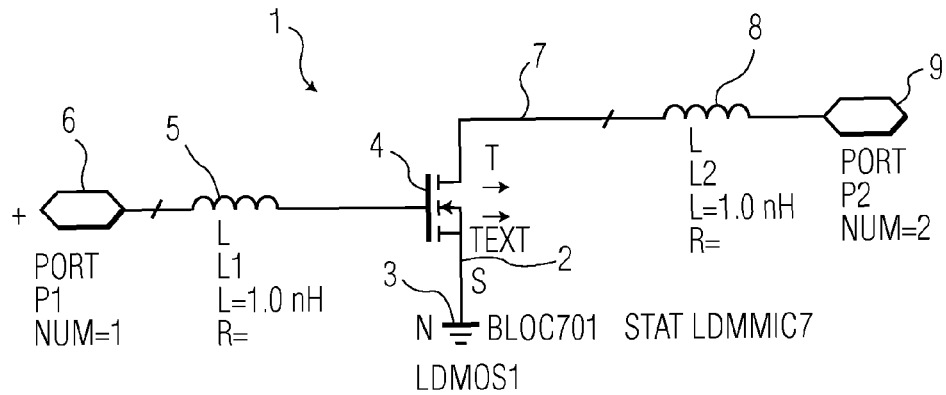
FIG. 1 shows a circuit diagram of a transistor structure including bond wires connected to the gate and drain.

FIG. 1 shows a transistor structure 1 comprising a lateral double-diffused metal-oxide-semiconductor (LDMOS) transistor that is suitable for use as a power amplifier in a cellular base station, for example. It will be appreciated that the transistor structure may comprise a different type of transistor and may have different uses. The transistor structure 1 includes a source terminal 2 connected to ground 3, which is provided by an electrically conductive substrate. A gate terminal 4 of the transistor structure includes a gate terminal bond pad from which a bond wire 5 extends to provide a connection to the gate terminal 4. The bond wire 5 connects to a further bond pad 6. A drain terminal 7 of the transistor structure includes a drain terminal bond pad from which a bond wire 8 extends to provide a connection to the drain terminal 7. The bond wire 8 connects to a further bond pad 9. The bond wires 5, 8 are shown as inductances is FIG. 1.

Figure 2A:
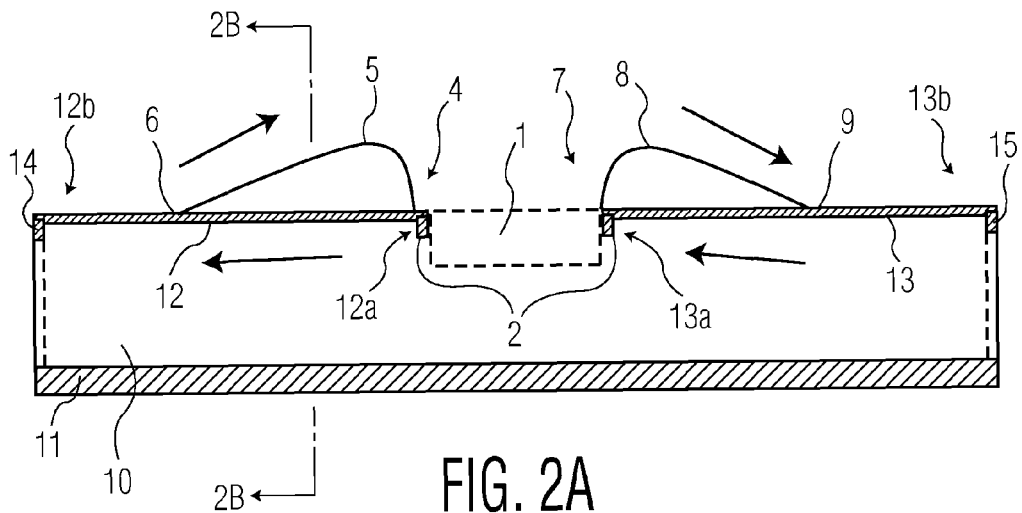
FIG. 2a shows a diagram showing the RF-return current path and bond wire.
Figure 2B:
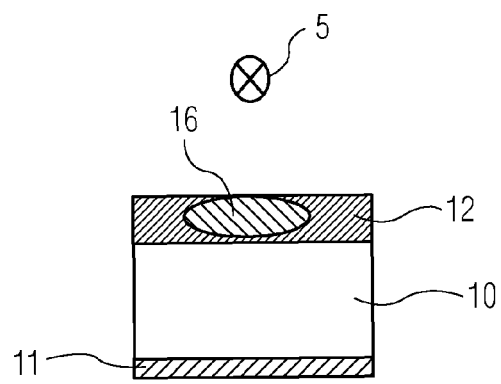
FIG. 2b shows a section through A-A of FIG. 2a illustrating the flow of the return current in the RF-return current path.

With reference to FIGS. 2a and 2b, the transistor structure 1 is formed on a semiconductor body 10, which is itself mounted on an electrically conductive substrate 11 acting as ground. The substrate 11 may be of low Ohmic silicon. The same reference numerals have been used for like parts. FIGS. 2a and 2b show an RF-return current path 12 extending beneath and following the path of bond wire 5 and a RF-return current path 13 extending beneath and following the path of bond wire 8. The RF-return current paths 12, 13 are provided to carry the return current associated with said bond wires 5, 8. The RF-return current paths 12, 13 comprise a metal strip arranged on said body 10. It will be appreciated that the RF-return current paths or strips 12, 13 are of a material that has a lower resistance than the semiconductor material of the substrate 11. The RF-return current strips 12,13 are connected at a first end 12a, 13a to the source terminal 2 of the transistor structure 1. The RF-return current strips 12,13 are connected at a second end 12b, 13b, opposite the first end, to the conductive substrate 11 by vias 14, 15 respectively.

FIG. 2b shows the bond wire 5 extending above the body 10 and having current flowing therethrough. The current flow in bond wire 5 causes a return current flow in the RF-return current path 12. It has been found that the return current flows in the conductive RF-return current paths 12, 13 rather than the body 10 or substrate 11, which leads to greater efficiency. The area 16 shows an area of high current density representing the return current flow being, in the majority, present in the RF-return current path 12.

Figure 3:
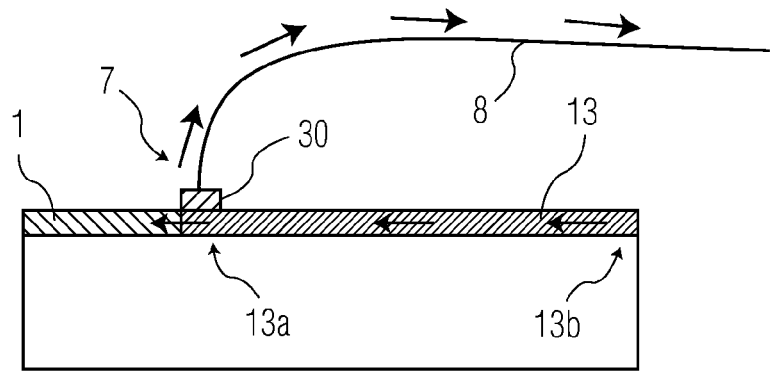
FIG. 3 shows a detailed sectional view of the RF-return current path at a first end.

FIG. 3 shows a more detailed view of the first end 13a of the RF-return current strip 13. In FIG. 3 the drain terminal bond pad 30 is visible, which connects directly to the drain terminal 7 of the transistor structure 1. The RF-return current strip 13 is configured to extend beneath the bond pad 30 and form a connection with the source terminal 2 of the transistor structure 1. The first end 13a may or may not have its own connection to the substrate 11 adjacent the source terminal of the transistor structure rather than connecting to the source terminal of the transistor structure 1.

Figure 4:
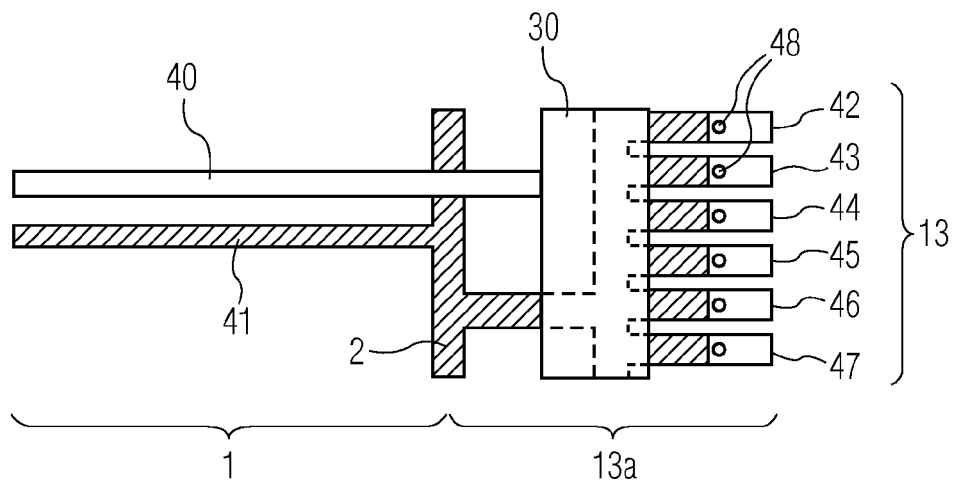
FIG. 4 shows a detailed plan view of the RF-return current path at the first end.

FIG. 4 illustrates the structure of the first end 12a, 13a in the region of the gate/drain bond pad. The transistor arrangement is formed of as layered structure, as is conventional. FIG. 4 shows a plan view in which the shaded structures are provided in a lower layer termed "Metal Layer Two" or M2. The non-shaded structures are provided in an uppermost layer, further from the substrate 11 and higher than M2, termed "Metal Layer 5" or M5. The dashed lines show the structure of parts in M2 when obscured by structures in M5. FIG. 4 shows a drain finger 40 which forms at least part of the drain 7 of the transistor structure 1. The drain finger 40 connects to the drain bond pad 30. The drain finger 40 and drain bond pad are formed in the M5 layer. A source finger 41 forms at least part of the source of the transistor structure 1. The source finger 41 terminates at the source terminal 2, which forms the edge of the transistor structure 1. It will be appreciated that a plurality of drain and source fingers may be provided as well as a plurality of gate runners, such configurations being known to those skilled in the art. The first end 13*a* of the RF-return path 13 extends from the source terminal 2 in layer M2 beneath the drain bond pad 30. The RF return path splits into a plurality of discrete strips 42, 43, 44, 45, 46, 47. The discrete strips may be formed in a region between the source terminal 2 and the bond pad 30, while beneath the bond pad or beyond the drain bond pad 30. The RF-return current path 13 extends from a point adjacent to the drain bond pad 30 in layer M5 up from the layer M2 in which it passed under the bond pad 30. The RF-return current path therefore extends from layer M2 to layer M5 by an array of vias 48 between M5 and M2. Although FIGS. 3 and 4 shows the drain bond pad and the RF-return current path 13, it will be appreciated that a similar structure can be provided for a gate bond pad and return path 12. Further, although layers M2 and M5 are described as carrying the RF-return current strips, it will be appreciated that any appropriate combination of layers may be used to extend the RF-current return strips under the bond pad to the source terminal of the active LDMOS transistor structure. Further, the plurality of discrete strips 42, 43, 44, 45, 46, 47 may be formed in different metal layers to control the metal density in any one layer. Thus, for example, every other strip may extend in M2 and the other strips may extend in M5 or any other combination of different layers. Further, the strips in different layers may overlap with respect to their widths.

Figure 5:
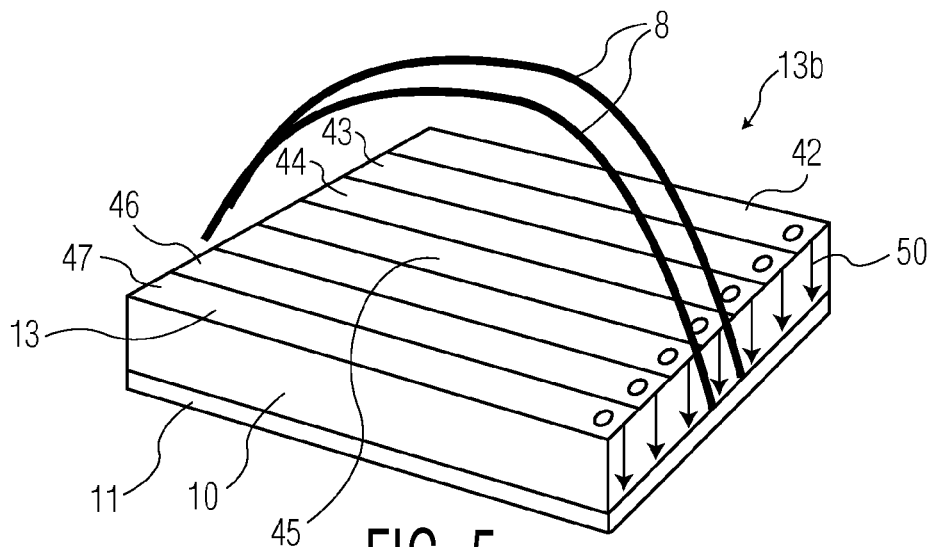
FIG. 5 shows a perspective view of the RF-return current path at a second end.

FIG. 5 shows a perspective view of the second end 13*b* of the RF-return current path 13. The RF-return current path 13 is formed of a plurality of discrete strips. The strips are unconnected along their length but may be connected at their ends, such as to a common source terminal as shown in FIG. 4. At the second end 13*b*, the strips 42-47 are connected to the substrate through the semiconductor body 10 by a plurality of vias 50. Thus, the connection at the source terminal and the connection by way of vias 50 are the only connections to the substrate for each strip. This is advantageous as the RF-return current structure can be manufactured efficiently. The second end 13*b* of the strips extends to the edge of the semiconductor body 10, which comprises the die edge. FIG. 5 also shows the bond wires 8 extending over the semiconductor body 10. The bond wires 8 and strips 42-27 are arranged such that the strips substantially aligns with and tracks the path of the over arching bond wires to provide an efficient RF-return current path. Thus, the number of strips may correspond to the number of bond wires, such that a strip is provided for each bond wire (only two bond wires are shown in FIG. 5 for simplicity rather than one bond wire for each of the strips). The RF-return current strips may extend outside the width of the track of the bond wires and thus, may have a width of approximately 30 μm or up to 30 μm. Alternatively, a plurality of strips may be provided for each bond wire. Thus, several current return paths may be provided by two or more strips for a single bond wire. If several strips are provided for each bond wire, the strips may overlap in width, with adjacent strips provided in different layers. Therefore, adjacent strips may overlap to cover the substrate but are not in electrical contact over their length as they are provided in different layers. Thus, the strips comprise separate electrical paths along their lengths. Some bond wires may have a plurality of strips providing return current paths while other bond wires may have a single strip.

Figure 6:
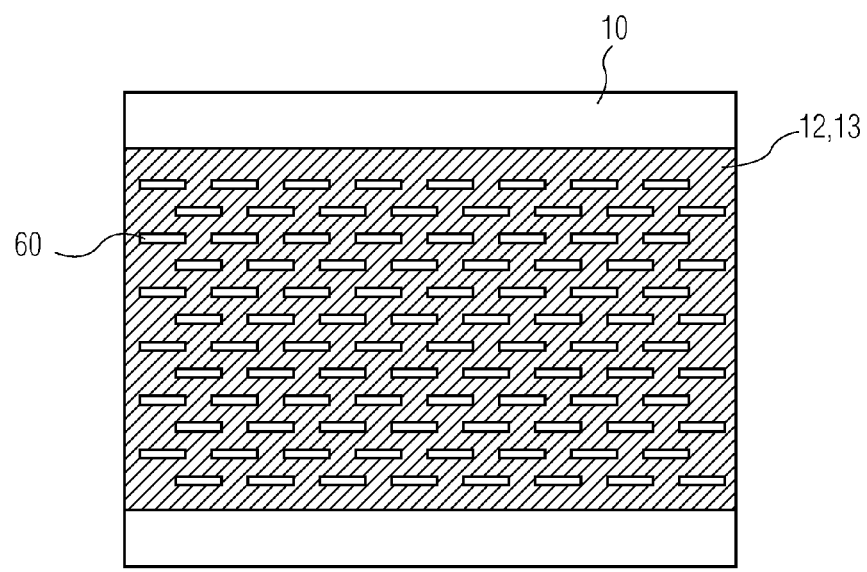
FIG. 6 shows a detailed view of the RF-return current path including slots.

FIG. 6 shows a part of a RF-return current strip 12, 13. The RF-return current strip includes a plurality of slots 60. The slots 60 comprise apertures through the thickness of the strip. The slots 60 form package locking points in the continuous strips 12,13. It is advantageous to form the RF-return current structure as a plurality of discrete strips because avoiding large areas of continuous metal reduces the risk of metal pattern cracks. Further, providing slots in the strips further improves the risk of metal pattern cracks. The strips and slots also have a further advantage in providing an uneven upper surface to which a package can reliably engage. Thus the strips and slots act to provide a surface relief that resists delamination of a package therefrom. The package may comprise an integrated circuit package in which the field effect transistor arrangement is mounted.

Figure 7:
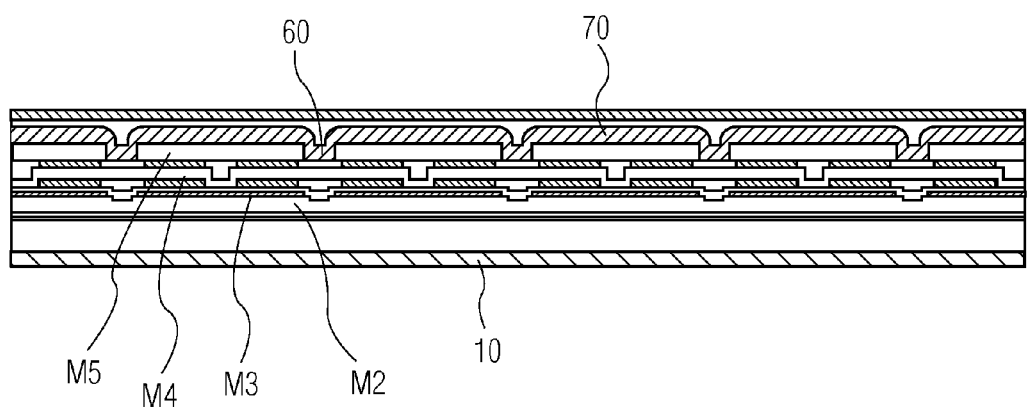
FIG. 7 shows a section view of the RF-return current path shown in FIG. 6.

FIG. 7 shows a cross section through the strip shown in FIG. 6 with a package layer 70 of a package applied thereto. The package layer, which may be of moulding compound, is shown extending into the apertures formed by the slots 60 to provide a reliable connection between the uppermost layer M5 (in this embodiment) and the package layer 70.

The invention claimed is:

1. A transistor arrangement comprising;
   an electrically conductive substrate;
   a semiconductor body including a transistor structure, the transistor structure including a source terminal connected to said electrically conductive substrate;
   a bond pad providing a connection to the transistor structure configured to receive a bond wire, wherein the semiconductor body includes an RF-return current path configured to carry a return current associated with said bond wire, said RF-return current path comprising a strip of metal arranged on said semiconductor body, said RF-return current strip configured such that it extends beneath said bond pad and is connected to said source terminal of the transistor structure.

2. The transistor arrangement according to claim 1, wherein said RF-return current strip extends to an edge of the semiconductor body.

3. The transistor arrangement according to claim 2, wherein the RF-return current strip is connected to the source terminal at a first end and to the electrically conductive substrate at a second, opposite end by at least one via element.

4. The transistor arrangement according to claim 3, wherein the RF-return current strip is only connected to the electrically conductive substrate at its first and second ends.

5. The transistor arrangement according to claim 3, wherein the RF-return current path is, at the second end, connected to the electrically conductive substrate by a connection of a matching capacitor forming, with the bond wire, at least part of a matching network.

6. The transistor arrangement according to claim 1, further comprising:
   a plurality of discrete RF-return current strips, wherein each strip is configured to provide a discrete return current path.

7. The transistor arrangement according to claim 1, wherein the or each RF-return current strip comprises the uppermost layer of the transistor arrangement.

8. The transistor arrangement according to claim 1, wherein the RF-return current strip includes a plurality of slots formed in its surface, said slots forming package locking points.

9. The transistor arrangement according to claim 8, wherein the transistor arrangement is formed within a package and said package physically engages with said slots.

10. The transistor arrangement according to claim 1, wherein at least one bond wire extends from the bond pad, and said RF-return current strip and said bond wire are arranged such that the RF-return current strip follows a path that extends directly beneath said bond wire.

11. The transistor arrangement according to claim 1, wherein said RF-return current strip is continuous and extends through different layers formed on the semiconductor body.

12. The transistor arrangement according to claim 1, further comprising:
   a passive component, wherein said RF-return current path is configured to provide a connection to the electrically conductive substrate for the passive component.

13. The transistor arrangement according to claim 1 in which the transistor structure comprises a LDMOS transistor.

14. A power amplifier comprising the transistor arrangement of claim 1.

15. A cellular base station including the power amplifier of claim 14.

* * * * *